(12) United States Patent
Kidnie et al.

(10) Patent No.: US 10,788,746 B2
(45) Date of Patent: *Sep. 29, 2020

(54) RELIEF IMAGE-FORMING METHOD AND ASSEMBLY

(71) Applicant: MIRACLON CORPORATION, Oakdale, MN (US)

(72) Inventors: Kevin M. Kidnie, St. Paul, MN (US); Elsie Anderson Fohrenkamm, St. Paul, MN (US); M. Zaki Ali, Mendota Heights, MN (US)

(73) Assignee: MIRACLON CORPORATION, Oakdale, MN (US)

( * ) Notice: Subject to any disclaimer, the term of this patent is extended or adjusted under 35 U.S.C. 154(b) by 170 days.

This patent is subject to a terminal disclaimer.

(21) Appl. No.: 15/898,391

(22) Filed: Feb. 16, 2018

(65) Prior Publication Data

US 2019/0258154 A1 Aug. 22, 2019

(51) Int. Cl.

| | | |
|---|---|---|
| *G03F 7/20* | (2006.01) | |
| *G03F 1/38* | (2012.01) | |
| *G03F 1/76* | (2012.01) | |
| *G03F 7/32* | (2006.01) | |
| *G03F 7/038* | (2006.01) | |
| *G03F 7/16* | (2006.01) | |
| *G03F 7/11* | (2006.01) | |

(52) U.S. Cl.
CPC .................. *G03F 1/38* (2013.01); *G03F 1/76* (2013.01); *G03F 7/038* (2013.01); *G03F 7/11* (2013.01); *G03F 7/16* (2013.01); *G03F 7/2002* (2013.01); *G03F 7/202* (2013.01); *G03F 7/2014* (2013.01); *G03F 7/2016* (2013.01); *G03F 7/325* (2013.01)

(58) Field of Classification Search
CPC ........................................................ G03F 7/20
See application file for complete search history.

(56) References Cited

U.S. PATENT DOCUMENTS 5,171,650 A 12/1992 Ellis et al.
5,695,907 A 12/1997 Chang
(Continued)

FOREIGN PATENT DOCUMENTS

JP 2000-033780 A 2/2000

*Primary Examiner* — Chanceity N Robinson
(74) *Attorney, Agent, or Firm* — Maschoff Brennan

(57) ABSTRACT

A relief image is prepared by: A) imaging an imageable material to form a mask element; B) exposing a relief-forming precursor through the mask element; C) removing the mask element; and D) developing the imaged relief-forming precursor. The imageable material has, in order: (a) a transparent polymeric carrier sheet; (b) a non-ablatable light-to-heat converting having an average dry thickness of 1-5 μm and comprising: (i) an infrared radiation absorbing material at 0.1-5 weight %; (ii) a thermally crosslinked organic polymeric binder material; and (iii) non-thermally ablatable particles having an average particle size of 0.1-20 μm in an amount of 0.2-10 weight %; and (c) a non-silver halide thermally-ablatable imaging layer (IL) disposed on the LTHC layer, the IL comprising a second infrared radiation absorbing material and a UV-light absorbing material dispersed within one or more thermally-ablatable polymeric binder materials. The imageable material can be included in a relief image-forming assembly.

22 Claims, 4 Drawing Sheets

(56) References Cited

U.S. PATENT DOCUMENTS

| | | | |
|---|---|---|---|
| 5,759,741 | A | 6/1998 | Pearce et al. |
| 5,935,902 | A | 8/1999 | Imamura |
| 6,235,445 | B1 | 5/2001 | Nakamura et al. |
| 6,368,772 | B1 | 4/2002 | Telser et al. |
| 6,461,793 | B2 | 10/2002 | Chang et al. |
| 6,680,089 | B2 | 1/2004 | Miyake et al. |
| 7,226,709 | B1 | 6/2007 | Kidnie et al. |
| 7,799,504 | B2 | 9/2010 | Zwadlo et al. |
| 7,802,598 | B2 | 9/2010 | Zwadlo et al. |
| 8,142,987 | B2 | 3/2012 | Ali et al. |
| 8,771,925 | B2 | 7/2014 | Fohrenkamm et al. |
| 8,945,813 | B2 | 2/2015 | Kidnie |
| 9,005,884 | B2 | 4/2015 | Yawata et al. |
| 9,250,527 | B2 | 2/2016 | Kidnie |
| 2005/0227182 | A1* | 10/2005 | Ali ................... G03F 7/0035 430/311 |
| 2006/0127805 | A1* | 6/2006 | Ali ....................... G03F 1/68 430/270.1 |
| 2014/0315129 | A1* | 10/2014 | Kidnie .................. B41C 1/00 430/273.1 |
| 2018/0136561 | A1* | 5/2018 | Ollmann, Jr. ........... G03F 7/322 |

\* cited by examiner

RELIEF IMAGE-FORMING METHOD AND ASSEMBLY

RELATED APPLICATION

This application is related to the following copending and commonly assigned patent application:

U.S. Ser. No. 15/898,309 filed on same date herewith by Kidnie, Fohrenkamm, and Ali, and entitled "Mask Element Precursor and Relief Image-forming System".

FIELD OF THE INVENTION

This invention relates to a method for making a relief image using a mask element that contains a unique non-ablatable light-to-heat converting (LTHC) layer that provides more intimate contact with a relief-forming precursor during imaging.

BACKGROUND OF THE INVENTION

Radiation-sensitive relief-forming materials having a suitable relief-forming material or photosensitive layer are known in the art. Important advances in the art and useful materials for making flexographic relief images are described in U.S. Patent Application Publication 2005/0227182 (Ali et al., hereinafter cited as U.S. '182). This publication describes useful materials and methods for providing flexographic printing plates having a suitable relief image, using a thermally sensitive mask-forming imageable material to form a mask element.

Thus, a relief image can be produced by first creating a mask element, for example by thermally imaging a suitable masking film or mask element precursor to provide the desired pattern (generally using an infrared radiation laser under computer control) through which a photocurable or photosensitive material is imaged, typically using ultraviolet radiation. U.S. '182 describes suitable mask element precursors, photosensitive materials, and process and apparatus for forming a mask element and eventual relief image.

Typically, a mask element can be placed in intimate contact with a photosensitive relief-forming precursor using a laminator device or vacuum drawdown, or both, and subjected to overall exposure with actinic radiation (for example, UV radiation) to cure the photosensitive composition in the relief-forming precursor in the unmasked areas, thus forming a negative image of the mask element in the photosensitive relief-forming precursor. The mask element can then be removed and the uncured regions on the relief-forming material can be removed using a development process. After drying, the resulting imaged relief-forming precursor has a relief image that can be used for flexographic or letterpress printing operations.

Advances in mask element precursors are described in U.S. Pat. No. 7,799,504 (Zwadlo et al.). Other useful mask element precursors and processes for their use are described in U.S. Pat. No. 8,198,012 (Zwadlo et al.) and U.S. Pat. No. 9,250,527 (Kidnie).

While the mask element precursors described in these publications have found considerable value in the flexographic industry, there is a need to further improve the process for making the mask elements in an efficient manner and to improve interlayer adhesion, intimate contact of mask element and relief-forming precursor during imaging when a lamination process is used, and a better draw-down of the mask element to the relief-forming precursor when vacuum draw-down is used.

SUMMARY OF THE INVENTION

The present invention provides a method for making a relief image in a relief image element, the method comprising, in order:

A) imaging an imageable material to form a mask element;

B) exposing a relief-forming precursor comprising a UV-sensitive layer with curing radiation through the mask element, to form an imaged relief-forming precursor with exposed hardened regions and non-exposed regions in the UV-sensitive layer, C) removing the mask element; and D) developing the imaged relief-forming precursor by removing the non-exposed regions in the UV-sensitive layer, thereby forming a relief image element having a relief image, the imageable material consisting essentially of, in order:

(a) a transparent polymeric carrier sheet;

(b) a non-ablatable light-to-heat converting (LTHC) layer disposed directly on the transparent polymeric carrier sheet, the LTHC layer having an average dry thickness of at least 1 µm and up to and including 5 µm, and comprising: (i) a first infrared radiation absorbing material in an amount of at least 0.1 weight % and up to and including 5 weight %; (ii) a thermally crosslinked organic polymeric binder material; and (iii) non-thermally ablatable particles having an average particle size of at least 0.1 µm and up to and including 20 µm and that are present in an amount of at least 0.2 weight % and up to and including 10 weight %, all weight percentages being based on the total dry weight of the LTHC layer;

(c) a non-silver halide thermally-ablatable imaging layer (IL) disposed directly on the LTHC layer, the IL comprising a second infrared radiation absorbing material and a UV-light absorbing material dispersed within one or more thermally-ablatable polymeric binder materials; and the imageable material optionally further comprising (d) a transparent polymeric overcoat layer disposed directly on the IL.

Moreover, a relief image-forming system of the present invention, comprises:

(1) an imageable material;

(2) a relief-forming precursor comprising a UV-sensitive layer; and (3) a developer in which the UV-sensitive layer is soluble or dispersible, the imageable material consisting essentially of, in order:

(a) a transparent polymeric carrier sheet;

(b) a non-ablatable light-to-heat converting (LTHC) layer disposed directly on the transparent polymeric carrier sheet, the LTHC layer having an average dry thickness of at least 1 µm and up to and including 5 µm, and comprising: (i) a first infrared radiation absorbing material in an amount of at least 0.1 weight % and up to and including 5 weight %; (ii) a thermally crosslinked organic polymeric binder material; and (iii) non-thermally ablatable particles having an average particle size of at least 0.1 µm and up to and including 20 µm and that are present in an amount of at least 0.2 weight % and up to and including 10 weight %, all weight percentages being based on the total dry weight of the LTHC layer;

(c) a non-silver halide thermally-ablatable imaging layer (IL) disposed directly on the LTHC layer, the IL comprising a second infrared radiation absorbing material and a UV-light absorbing material dispersed within one or more thermally-ablatable polymeric binder materials; and the imageable material optionally further comprising (d) a transparent polymeric overcoat layer disposed directly on the IL.

A relief image-forming assembly according to the present invention, consists essentially of:

a mask element in complete optical contact with a relief-forming precursor comprising a UV-sensitive layer, the mask element derived by imaging an imageable material consisting essentially of, in order:

(a) a transparent polymeric carrier sheet;

(b) a non-ablatable light-to-heat converting (LTHC) layer disposed directly on the transparent polymeric carrier sheet, the LTHC layer having an average dry thickness of at least 1 µm and up to and including 5 µm, and comprising: (i) a first infrared radiation absorbing material in an amount of at least 0.1 weight % and up to and including 5 weight %; (ii) a thermally crosslinked organic polymeric binder material; and (iii) non-thermally ablatable particles having an average particle size of at least 0.1 µm and up to and including 20 µm and that are present in an amount of at least 0.2 weight % and up to and including 10 weight %, all weight percentages being based on the total dry weight of the LTHC layer;

(c) a non-silver halide thermally-ablatable imaging layer (IL) disposed directly on the LTHC layer, the IL comprising a second infrared radiation absorbing material and a UV-light absorbing material dispersed within one or more thermally-ablatable polymeric binder materials; and the imageable material optionally further comprising (d) a transparent polymeric overcoat layer disposed directly on the IL.

The present invention provides several advantages. It provides improved intimate contact of the mask element and the relief-forming precursor during imaging when a lamination process is used, and a better vacuum draw-down of the mask element to the relief-forming precursor when a vacuum draw-down process is used. The improved interlayer adhesion prevents undesirable interlayer adhesion failure that can lead to poorer imaging quality on the photopolymer printing plate. Intimate contact and better vacuum draw-down of a mask element and a relief-forming precursor is improved during imaging so that undesirable artifacts are minimized.

In addition, the mask element provided according to this invention exhibits improved interlayer adhesion so that the opportunity for contamination of the relief image surface with residual material from the mask element is reduced.

These advantages are provided by the presence of a light-to-heat converting (LTHC) layer adjacent the thermally-sensitive, non-silver halide thermally-ablatable imaging layer (IL), which LTHC layer contains an infrared radiation absorbing material, a thermally crosslinked organic polymeric binder, and non-thermally ablatable particles. The LTHC layer helps to converts imaging infrared radiation into heat and assists in more complete ablation of the IL during creation of a mask image.

Further advantages of the present invention will become apparent from the following detailed description of the invention.

DETAILED DESCRIPTION OF THE INVENTION

Figure 1A:
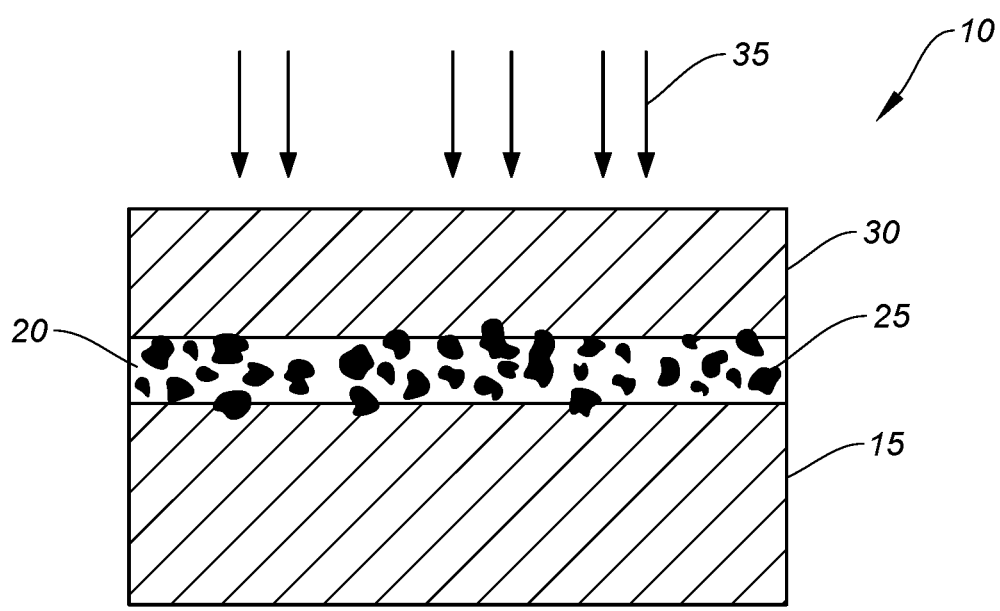
FIG. 1A is a cross-sectional schematic illustration of one embodiment of an imageable material according to the present invention, and showing incident infrared radiation useful for making a mask element.

The following discussion is directed to various embodiments of the present invention and while some embodiments can be desirable for specific uses, the disclosed embodiments should not be interpreted or otherwise considered to limit the scope of the present invention. In addition, one skilled in the art will understand that the following disclosure has broader application than the discussion of specific embodiments.

Definitions

As used herein to define various components of the non-ablatable light-to-heat converting (LTHC) layer, non-silver halide thermally-ablatable imaging layer (IL), and other materials, layers, and compositions (for example, a developer or processing solution) used in the practice of this invention, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term should be interpreted to have a standard dictionary meaning.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges may be useful to achieve substantially the same results as the values within the ranges. In addition, the disclosure of these ranges is intended as a continuous range including every value between the minimum and maximum values as well as the end points of the ranges.

The non-ablatable light-to-heat converting layer is also identified herein as the LTHC layer.

The non-silver halide thermally-ablatable imaging layer is also identified herein as the IL.

Unless indicated herein, the term "imageable material" is used to refer to embodiment articles prepared and used according to the present invention. Such imageable materials can also be known as "mask films," "mask precursors," or "masking elements." The imageable material can be transformed into a "mask element" with suitable thermal (IR) imaging, which mask element contains a mask image that can be used to form a relief image according to the present invention.

Unless otherwise indicated, percentages are by weight.

The term "relief-forming precursor" used herein refers to any imageable element or imageable material in which a relief image can be produced by exposure through a mask element. Examples of such relief-forming precursors are described in detail below but some relief-forming precursors include flexographic printing plate precursors, letterpress printing plate precursors, and printed circuit boards. Details of useful relief-forming materials are described in U.S. Patent Application Publication 2005/0227182 (noted above), the disclosure of which is incorporated herein by reference. In this publication, the relief-forming precursors are generally identified as "radiation-sensitive elements."

Unless otherwise indicated, the term "ablative" or "ablation" refers to thermal imaging by means of a laser that causes rapid local changes in the non-silver halide thermally-ablatable imaging layer (IL) of an imageable material thereby causing the material(s) in the IL to be ejected from the IL. This is distinguishable from other material transfer or imaging techniques such as melting, evaporation, or sublimation.

The terms "optical contact" and "complete optical contact" have the same meaning and refer to two layers or two elements (as in the case of the mask element and a relief-forming precursor) sharing an interface and being in intimate physical contact so that there is essentially no air-gap or void between the contacting surfaces, thus providing an "air-free interface." More precisely, two surfaces are defined as being in optical contact when the reflection and transmission characteristics of their interface are essentially fully described by the Fresnel laws for the reflection and transmission of light at the refractive-index boundary.

Unless otherwise noted, the term "transparent" used herein refers to the ability of a material or layer to transmit at least 95% of impacting (or incident) electromagnetic radiation, such as electromagnetic radiation having a wavelength of at least 200 nm to and including 750 nm (that is, what are generally known in the art as UV and visible radiation). The transparent polymeric carrier sheet and LTHC layer described below particularly have this property.

"Average dry thickness" of a given dry layer is generally an average of 10 different measurements of a dry cross-sectional image of that layer.

Imageable Materials

The imageable material according to the present invention can also be considered a "mask element precursor." It is an improvement over those known in the art, including those described for example, in U.S. Pat. No. 7,799,504 (Zwadlo et al.) and U.S. Pat. No. 9,250,527 (Kidnie). Specifically, the imageable material according to the present invention has only three essential layers or films as described below, in order: a (a) transparent polymeric carrier sheet; a (b) LTHC layer; and a (c) non-silver halide thermally-ablatable imaging layer (IL). Only these three layers or films are essential for forming a mask element having a mask image. However, as noted below, in some embodiments, a (d) transparent polymeric overcoat layer can be disposed directly on the IL, but this optional feature is not required for forming or using a mask image. Rather, it can be helpful in some uses for providing abrasion resistance.

The imageable material is used to form a mask element that is used eventually to form a relief image. One embodiment of the present invention is illustrated as imageable material 10 in FIG. 1A, which has (a) transparent polymeric carrier sheet 15, on which is directly disposed (b) LTHC layer 20 containing non-thermally ablatable particles 25 that are described in more detail below, and (c) IL 30 that is disposed directly on LTHC layer 20.

The following discussion provides additional details of each component of imageable layers according to the present invention.

Transparent Polymeric Carrier Sheet:

The transparent polymeric carrier sheet can be any suitable transparent substrate or film. Useful transparent polymeric carrier sheets can be but are not limited to, transparent polymeric films and sheets composed of one or more polymers such as polyesters including poly(ethylene terephthalate), poly(ethylene naphthalate), and fluorine polyester polymers; polyethylene-polypropylene copolymers; polybutadienes; polycarbonates; polyacrylates (polymers formed at least in part from one or more (meth)acrylate ethylenically unsaturated monomers); vinyl chloride polymers such as polyvinyl chloride and copolymers derived at least in part from vinyl chloride; hydrolyzed or non-hydrolyzed cellulose acetates; and other materials that would be readily apparent to one skilled in the art. The transparent polymeric carrier sheets can be composed of two or more polymeric materials as a blend or composite as long as the requisite transparency and protective properties are achieved. They can be formed as a single polymeric film or laminate of multiple polymeric films. Generally, the transparent polymeric carrier sheet has an average dry thickness of at least 25 μm and up to and including 250 μm, or typically of at least 75 μm and up to and including 175 μm.

For example, a transparent poly(ethylene terephthalate) sheet that is available from various commercial sources is suitable as a transparent polymeric carrier sheet.

If necessary, the transparent polymeric carrier sheet surface can be treated to modify its wettability and adhesion to applied coatings (such as an LTHC layer coating). Such surface treatments include but are not limited to corona discharge treatment and the application of subbing layers as long as the desired transparency (described above) is achieved.

If desired, the transparent polymeric carrier sheet can also comprise one or more "first" ultraviolet radiation absorbing compounds (as described below for the LTHC layer or IL). The one or more compounds of this type can be the same or different as the ultraviolet radiation absorbing compounds in the IL (see below). Each useful ultraviolet radiation absorbing compound generally absorbs electromagnetic radiation of at least 150 nm and up to and including 450 nm. These compounds can be present in the transparent polymeric carrier sheet in an amount of at least 0.01 weight % and up to and including 0.1 weight %, based on the total dry weight of the transparent polymeric carrier sheet.

In addition, the transparent polymeric carrier sheet can contain one or more "adhesion promoters" that improve adhesion between it and the adjacent LTHC layer. Useful adhesion promoters include but are not limited to, gelatin, poly(vinylidene chloride), poly (acrylonitrile-co-vinylidene chloride-co-acrylic acid), and polyethyleneimine.

Non-ablatable Light-to-Heat Converting (LTHC) Layer:

The imageable material of this invention also comprises a LTHC layer disposed on the transparent polymeric carrier sheet and directly between the transparent polymeric carrier sheet and the IL. Suitable LTHC layer compositions have three essential components: a (i) first infrared radiation absorbing material; a (ii) thermally crosslinked organic polymeric binder material; and (iii) non-thermally ablatable particles. The LTHC layer is generally disposed as a relatively uniform coating on the transparent polymeric carrier sheet (that is, being substantially continuous and having fairly uniform wet thickness) and then dried if any solvent is present in the composition formulation.

The LTHC layer is generally transparent as that term is defined above. In particular, the LTHC layer is transparent to UV radiation used to image the relief-forming precursor, as defined below.

One or more infrared absorbing materials that are collectively identified herein as the "first" infrared radiation absorbing material to distinguish it, if necessary, from the second infrared radiation absorbing material(s) in the IL (described below). The first and second infrared radiation absorbing materials can be one or more dyes or pigments, or mixtures thereof that will provide desired spectral absorption properties and are independently sensitive to electromagnetic radiation in the electromagnetic wavelength range of at least 700 nm and up to and including 1500 nm and typically of at least 750 nm and up to and including 1200 nm. Such materials can be particulate in nature and are dispersed within the (ii) thermally crosslinked organic polymeric binder material(s) described below. For example, they can be black dyes or pigments such as carbon black, metal oxides, and other materials described for example in U.S. '182 (noted above).

One suitable IR-absorbing pigment is a carbon black of which there are numerous types with various particles sizes that are commercially available. Examples include RAVEN 450, 760 ULTRA, 890, 1020, 1250 and others that are available from Columbian Chemicals Co. (Atlanta, Ga) as well as BLACK PEARLS 170, BLACK PEARLS 480, VULCAN XC72, BLACK PEARLS 1100 and others available from Cabot Corporation. Other useful carbon blacks are surface-functionalized with solubilizing groups. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

Useful first infrared radiation absorbing materials also include IR dyes including but not limited to, cationic infrared-absorbing dyes and photothermal-bleachable dyes. Examples of suitable IR dyes include but are not limited to, azo dyes, squarilium dyes, croconate dyes, triarylamine dyes, thiazolium dyes, indolium dyes, oxonol dyes, oxazolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,569,603 (Furukawa), and U.S. Pat. No. 6,787,281 (Tao et al.), and EP Publication 1,182,033 (Fijimaki et al.). A general description of one class of suitable cyanine dyes is shown by the formula in paragraph [0026] of WO 2004/101280.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.), the disclosures of all of which are incorporated herein by reference. Suitable dyes may be formed using conventional methods and starting materials or obtained from various commercial sources including American Dye Source (Baie D'Urfe, Quebec, Canada) and FEW Chemicals (Germany).

The first infrared radiation absorbing material(s) is generally present in an amount sufficient to provide a transmission optical density of at least 0.025 and typically of at least 0.05 at the exposing electromagnetic radiation wavelength. Generally, this is achieved by including at least 0.1 weight % and up to and including 5 weight %, or typically at least 0.3 weight % and up to and including 3 weight %, based on the total dry weight of the LTHC layer.

The first infrared radiation absorbing material in the LTHC layer can be the same or different chemical material (s) as the second infrared radiation absorbing compound that is incorporated into the IL as described below. In most embodiments, the first and second infrared radiation absorbing materials are the same chemical materials. The amounts of the first and second infrared radiation absorbing materials in the imageable material can be the same or different. In most embodiments, they are present in different amounts in the imageable material.

In addition, the LTHC layer comprises one or more thermally crosslinked organic polymeric binders derived from thermally crosslinkable organic polymeric binders. The term "thermally crosslinkable" means that crosslinking groups are present and include for example, hydroxy-containing polymers. Particularly useful thermally crosslinkable organic polymeric binders include but are not limited to, crosslinkable nitrocellulose; crosslinkable polyesters such as polyesters containing hydroxy groups; polyvinyl alcohol's; polyvinyl acetals such as polyvinyl butyral; or a combination of two or more of such crosslinkable organic polymeric materials. The corresponding crosslinked organic polymeric binders can be obtained from the noted thermally crosslinkable polymeric binders.

The thermally crosslinked organic polymeric binders are present in the LTHC layer in an amount of at least 40 weight % and up to and including 90 weight %, or more likely in an amount of at least 50 weight % and up to and including 80 weight %, all based on total dry weight of the LTHC layer.

A third essential component of the LTHC layer are non-thermally ablatable particles having an average particle size of at least 0.1 µm and up to and including 20 µm, or at least 5 µm and up to and including 15 µm. The term "average" is used here to refer to measurements of particle size of the dispersed particles and can be determined from either a manufacturer's specification or by measuring at least 10 different particles and taking an average.

The term "non-thermally ablatable" is used here to mean that the particles are not sensitive to the laser imaging wavelength and intensity compared to materials that are strongly affected by the laser imaging ablation process. Materials that are sensitive to the laser thermal imaging ablation process have strong absorption to the laser wavelength of the imaging laser and have low thermal decomposition temperatures. Conversely, particles used in the present invention are not strongly absorbing of the laser imaging wavelength and do not have very low thermal decomposition temperatures. Some of the non-thermally-ablatable particles can protrude out of the LTHC layer, for example, into the IL.

Non-thermally ablatable particles useful in the LTHC layer include but are not limited to, particles of silica, titanium dioxide, zinc oxide, or a combination of two or more types of such particles. Silica particles are particularly useful in the practice of this invention.

Moreover, such non-thermally ablatable particles can be present in the LTHC layer in an amount of at least 0.2 weight % and up to and including 10 weight %, or at least 1 weight % and up to and including 7 weight %, all based on the total dry weight of the LTHC layer.

Optionally, the LTHC layer can comprise one or more thermal crosslinking agents to provide improved handling of the imageable material. Such optional thermal crosslinking agents facilitate crosslinking of the thermally crosslinkable organic binder polymers during coating and drying of the LTHC layer. Heat can be used for drying during formation of the mask element. The thermal crosslinking agent(s) can be present in an amount of at least 5 weight % and up to and including 25 weight %, based on the total dry weight of the LTHC layer. Such materials can include but are not limited to, melamine-formaldehyde resins, dialdehydes, phenolics, polyfunctional aziridines, isocyanates including polyisocyanates, and urea-formaldehyde epoxies.

The LTHC layer generally has an average dry thickness of at least 1 µm and up to and including 5 µm or typically at least 1 µm and up to and including 3 µm.

Non-silver Halide Thermally-Ablatable Imaging Layer (IL):

The IL incorporated into the imageable material is generally disposed directly on the LTHC layer as a relatively uniform coating (that is, being substantially continuous and having fairly uniform wet thickness) and then dried if any solvent is present in the formulation. In most embodiments, IL is a single coated or applied layer, but in other embodiments, there can be multiple sub-layers or sub-coatings making up the IL disposed directly on the LTHC layer described above.

There is essentially no silver halide present in the IL. In other words, no silver halide is purposely added or created in the IL.

The IL generally includes one or more ultraviolet radiation absorbing materials (UV-light absorbing materials) as an essential component. These compounds generally have an absorbance of at least 1.5 and up to and including 5 in an electromagnetic radiation wavelength range of at least 300 nm and up to and including 450 nm. In general, useful ultraviolet radiation absorbing materials include but are not limited to benzotriazoles, halogenated benzotriazoles, triazines, benzophenones, benzoates, salicylates, substituted acrylonitriles, cyanoacrylates, benzilidene malonates, oxalanilides, and mixtures thereof.

Examples of useful ultraviolet radiation absorbing materials include but are not limited to, UV absorbing dyes or UV stabilizers marketed under the names Uvinul® (BASF), Keyplast® (Keystone Aniline Corporation), Sanduvor® (Sandoz Chemicals Corp.), Hostavin (Clariant), and Tinuvin® (BASF or Ciba). Examples of useful materials are described in U.S. Pat. No. 5,496,685 (Farber et al.).

The one or more ultraviolet radiation absorbing compounds can be present in the IL in an amount of at least 10 weight % and up to and including 40 weight %, or typically at least 15 weight % and up to and including 30 weight %, based on the total dry weight of the IL.

The IL also comprises one or more second infrared radiation absorbing materials as a second essential component, which second infrared radiation absorbing materials are defined like the first infrared radiation absorbing materials described above for the LTHC layer, and they can be the same or different as the first infrared radiation absorbing materials. The one or more second infrared radiation absorbing materials can be present in the IL in an amount sufficient to provide a transmission optical density of at least 0.5 and typically of at least 0.75 at the exposing wavelength. Generally, this is achieved by including at least 3 weight % and up to and including 20 weight % of the one or more second infrared radiation sensitive compounds, based on the total dry weight of the IL.

The IL can optionally include one or more fluorocarbon additives for improved production of halftone dots (that is, pixels) having well-defined, generally continuous, and relatively sharp edges. Examples of useful fluorocarbon additives and amounts are provided in [0087] to [0089] of U.S. '182 (noted above).

Additional optional components of the IL include but are not limited to, plasticizers, coating aids or surfactants, dispersing aids, fillers, and non-thermally ablatable colorants, all of which are well known in the art as described for example in [0094] to [0096] of U.S. '182 (noted above).

For example, the IL further can comprise one or more fluorocarbon additives or one or more non-thermally ablatable colorants.

All the essential and optional components described above for the IL are dispersed in one or more thermally-ablatable polymeric binder materials that include both synthetic and naturally occurring polymeric materials. Such materials are capable of dissolving or dispersing the essential and optional components in a uniform manner throughout the IL. The one or more thermally-ablatable polymeric binder materials can be present in an amount of at least 25 weight % and up to and including 75 weight %, or typically of at least 35 weight % and up to and including 65 weight %, based on the total dry weight of the IL.

Useful thermally-ablatable polymeric binder materials include but are not limited to, the materials described for example in [0081] to [0085] of US '182. These materials can also be known as "adhesive binders" as described for example in [0081] of U.S. '182. Examples of such materials include but are not limited to, acetyl polymers such as poly(vinyl butyral)s that can be obtained for example as BUTVAR® B-76 from Solution, Inc. (St. Louis, Mo.) and acrylamide polymers that can be obtained as MACROMELT 6900 from Henkel Corp. (Gulph Mills, Pa.). Pressure-sensitive adhesive polymers can also be used for this purpose.

In some embodiments, it is advantageous to use materials that are easily thermally-combustible or thermally-ablatable, and that generate gases and volatile fragments at temperature less than 200° C. Examples of these materials are thermally ablatable nitrocellulose, polycarbonates, poly(cyanoacrylate)s, polyurethanes, polyesters, polyorthoesters, polyacetals, and copolymers thereof (see for example, U.S. Pat. No. 5,171,650 of Ellis et al., Col. 9, lines 41-50, the disclosure of which is incorporated herein by reference).

Other useful materials have hydroxyl groups (or hydroxylic polymers) as described in [0082] to [0084] of U.S. '182 (noted above) such as poly(vinyl alcohol)s and cellulosic polymers (such as nitrocellulose). Still other useful polymers are non-crosslinkable polyesters, polyamides, polycarbamates, polyolefins, polystyrenes, polyethers, polyvinyl ethers, polyvinyl esters, and polyacrylates and polymethacrylates having alkyl groups with 1 and 2 carbon atoms.

Particularly useful materials include but are not limited to, a polyurethane, poly(vinyl butyral), (meth)acrylamide polymer, nitrocellulose, polyacetal, poly(cyanoacrylate), a polymer derived at least in part from any of methyl methacrylate, ethyl methacrylate, n-butyl methacrylate, and isobutyl methacrylate, or a combination of two or more of these materials.

The IL can have an average dry thickness of at least 0.5 µm and up to and including 5 µm or typically of at least 0.8 µm and up to and including 2.5 µm.

Transparent Polymeric Overcoat Layer:

In some embodiments, the imageable material optionally includes a transparent polymeric overcoat layer that is disposed directly on the IL, although such transparent polymeric overcoat layer is not essential to the advantages of the present invention. The transparent polymeric overcoat layer generally includes one or more transparent film-forming polymers or resins including but not limited to, a methacrylic acid copolymer (such as a copolymer of ethyl methacrylate and methacrylic acid) and particles of one or more fluoropolymers dispersed therein as described, for example, in U.S. Pat. No. 6,259,465 (Tutt et al.) the disclosure of which is incorporated herein by reference. The transparent polymeric overcoat layer can provide abrasion resistance during handling due to the presence of the fluoropolymer particulates. It can also act as a barrier to prevent chemical migration from the mask element to the relief-forming precursor when they are in complete optical contact.

When present, the transparent polymeric overcoat layer can be attached directly to the IL and can have an average dry thickness of at least 0.05 µm and up to and including 1 µm.

Relief-Forming Precursors

Considerable details of useful relief-forming precursors such as flexographic printing plate precursors, letterpress printing plate precursors, and printed circuit boards are provided in U.S. '182 (noted above). Such relief-forming precursors can include a suitable dimensionally stable substrate, at least one UV (ultraviolet)-sensitive layer, and optionally a space (or separation) layer, cover sheet, or metal layer. Suitable substrates include dimensionally stable polymeric films and aluminum sheets. Polyester films are particularly useful. Any UV-sensitive material or element in which a relief image can be produced using a mask element derived from the imageable material according to this invention is useful in the practice of this invention.

The relief-forming precursor can be positive- or negative-working, but typically, it is negative-working and generally includes a UV-sensitive layer (or photocurable or relief-image forming layer) containing a UV-radiation curable composition that is cured or hardened by polymerization or crosslinking upon exposure to the curing UV radiation. Many details of various components of the UV-sensitive relief-forming precursors are provided in U.S. '182 (noted above) and references cited therein.

Some embodiments of relief-forming precursors can include a removable cover sheet as well as a separation or spacer layer (sometimes referred to as anti-tack layer) disposed over the UV-sensitive layer, which separation or spacer layer helps removal of the cover sheet and protects the UV-sensitive layer from fingerprints and other handling damage and is disposed between the UV-sensitive layer and the cover sheet. Useful separation layer materials include but are not limited to, polyamides, poly(vinyl alcohols), copolymers of ethylene and vinyl acetate, amphoteric interpolymers, cellulosic polymers, poly(vinyl butyral), cyclic rubbers, and combinations thereof.

In most embodiments, the UV-sensitive layer comprises an elastomeric binder, at least one polymerizable or photocurable monomer, and a photopolymerizing photoinitiator that is sensitive to UV radiation. Suitable photoinitiator compositions include but are not limited to those described in U.S. Pat. No. 4,323,637 (Chen et al.), U.S. Pat. No. 4,427,749 (Gruetzmacher et al.), and U.S. Pat. No. 4,894,315 (Feinberg et al.) the disclosures of all of which are incorporated herein by reference.

The elastomeric binder can include more polymers or resins that can be soluble, swellable, or dispersible in aqueous, semi-aqueous, or organic solvent developers (described below) and can include but are not limited to, natural or synthetic polymers of conjugated diolefins, block copolymers, core-shell microgels, and blends of microgels and preformed macromolecular polymers. The elastomeric binder can comprise at least 65 weight % and up to and including 90 weight %, based on total dry UV-sensitive layer weight. More details of such elastomeric binders are provided in [0190] of U.S. '182 (noted above) and references cited therein.

The UV-sensitive imageable layer can also include one or more polymerizable monomers that are compatible with the elastomeric binder to the extent that a clear, non-cloudy UV-sensitive imageable layer is produced. Polymerizable monomers for this purpose are well known the art and include ethylenically unsaturated polymerizable compounds having relatively low molecular weight (generally less than 30,000 Daltons). Examples of suitable polymerizable monomers include but are not limited to, various mono- and polyacrylates, acrylate derivatives of isocyanates, esters, and epoxides. Specific polymerizable monomers are described in [0191] of U.S. '182 (noted above) and in references cited therein. The typical amount of one or more polymerizable monomers in the UV-sensitive layer is at least 5 weight % and up to and including 25 weight %, based on total dry weight of the UV-sensitive layer.

The photoinitiator can be a single compound or combination of compounds that are sensitive to UV radiation and that generate free radicals that initiate the polymerization of the polymerizable monomer(s) without excessive termination and can be generally present in an amount of from about 0.001 weight % and up to and including 10 weight % based on the total dry weight of the UV-sensitive layer. Examples of suitable photoinitiators include but are not limited to, substituted or unsubstituted polynuclear quinines and further details are provided in [0192] of U.S. '182 (noted above) and in references cited therein.

The UV-sensitive layer can include other addenda that provide various properties including but not limited to sensitizers, plasticizers, rheology modifiers, thermal polymerization inhibitors, tackifiers, colorants, antioxidants, antiozonants, and fillers, and all in amounts that are known in the art.

The thickness of the UV-sensitive layer can vary depending upon the type of relief-forming precursor desired. In some embodiments, a UV-sensitive layer can be at least 500 µm and up to and including 6400 µm in average dry thickness.

A spacer layer (or anti-tack layer) can be disposed on the UV-sensitive layer so that during its curing through a mask element, the spacer layer is between the mask element and UV-sensitive layer in a relief image-forming assembly (described below). In most embodiments, the spacer layer is in direct contact with both the mask element and the UV-sensitive layer of the relief-forming precursor and help provide intimate contact during imaging. This contact is generally "continuous," meaning that there are few or no gaps between the two elements in the relief image-forming assembly. The spacer layer can make it easier to remove the mask element from the imaged relief-forming precursor, and either element in the assembly can be peeled from each other after photocuring of the UV-sensitive layer to form both exposed hardened regions and non-exposed regions therein.

The spacer layer can have an average dry thickness of at least 0.05 µm and up to and including 2 µm, or typically of at least 0.05 µm and up to and including 0.2 µm.

The spacer layer can be composed of one or more polymers or resins including but not limited to, polyamides, poly(vinyl butyral), (meth)acrylamide polymers, nitrocellulose, polyacetals, polymers derived at least in part from any of methyl methacrylate, ethyl methacrylate, n-butyl methacrylate, and isobutyl methacrylate or a combination of two or more of these polymeric materials, which polymers can comprise at least 75 weight % and up to and including 100 weight % of the dry spacer layer weight. Various addenda can be present and include but not limited to surfactants and plasticizers.

In one embodiment according to this invention, the relief-forming precursor is a flexographic printing plate precursor that includes a suitable UV-curable composition in the UV-sensitive layer that when exposed through the mask element and developed, provides a relief image in a flexographic printing plate. Such relief-forming precursors generally include a suitable substrate, one or more UV-sensitive layer, each comprising a photosensitive composition that includes a polymer or prepolymers (such as polymerizable monomers), and photoinitiator. Examples of commercially available flexographic printing plate precursors include but are not limited to, FLEXCEL NX flexographic elements available from Eastman Kodak Company, CYREL® Flexographic plates available from DuPont (Wilmington, Del.), NYLOFLEX® FAR 284 plates available from BASF (Germany), FLEXILIGHT CBU plate available from Macdermid (Denver, Colo.), and ASAHI AFP XDI available from Asahi Kasei (Japan).

The relief-forming precursor can also be used to form a printed circuit board wherein a conducting layer (also known as a "printing circuit") is formed on a substrate in the pattern dictated by exposure through a mask element. Suitable precursors to printed circuit boards generally comprise a substrate, a metal layer, and a UV-sensitive imageable layer. Suitable substrates include but are not limited to, polyimide films, glass-filled epoxy or phenol-formaldehyde or any other insulating materials known in the art. The metal layer covering the substrate is generally a conductive metal such as copper or an alloy or metals. The UV-sensitive imageable layer can include an UV-curable resin, polymerizable monomers, or oligomers, photoinitiators, and a polymeric binder. Further details of printed circuit boards are provided in [0196] to [0205] of U.S. '182 (noted above).

The mask element described herein can also be used to prepare letterpress printing plates such as those described in U.S. Pat. No. 6,368,772 (Telser et al.) and those commercially provided as Printight® from Toyobo and Nyloprint® from FlintGroup.

Forming Mask Elements

In the practice of this invention, a mask element can be formed by producing exposed and non-exposed regions in the IL of the imageable material according to this invention. The choice of imaging mechanism will determine the possible variations in forming the mask image, as described below.

Exposing the imageable material can be carried out in selected regions, otherwise known as "imagewise exposure." In some embodiments, imagewise exposure can be accomplished using thermal radiation from a thermal or infrared laser that is scanned or rasterized under computer control. Any of the known scanning devices can be used including flat-bed scanners, external drum scanners, and internal drum scanners. In these devices, the imageable material is secured to the drum or bed, and the laser beam is focused to a spot that can impinge on the imageable material. Two or more lasers can scan different regions of the imageable material simultaneously.

For example, the imageable material can be exposed to infrared radiation, for example, in the electromagnetic wavelength range of at least 700 and up to and including 1500 nm. Such imageable materials contain one or more second infrared radiation absorbing materials in the IL as described above to provide sensitivity to exposing infrared radiation. In these embodiments, the imageable material can be suitably mounted to an infrared imager and exposed to the infrared radiation using an infrared laser such as a diode laser or Nd:YAG laser that can be scanned under computer control. Suitable infrared imagers include but are not limited to TRENDSETTER imagesetters and ThermoFlex Flexographic CTP imagers available from Eastman Kodak Company used for CTP lithographic plate applications and for imaging flexographic elements, DIMENSION imagesetters available from Presstek (Hudson, N.H.) useful for CTP lithographic plate applications, CYREL® Digital Imager (CDI SPARK) available from Esko-Graphics (Kennesaw, Ga.), and OMNISETTER imagers available from Misomex International (Hudson, N.H.) useful for imaging flexographic elements.

Figure 1B:
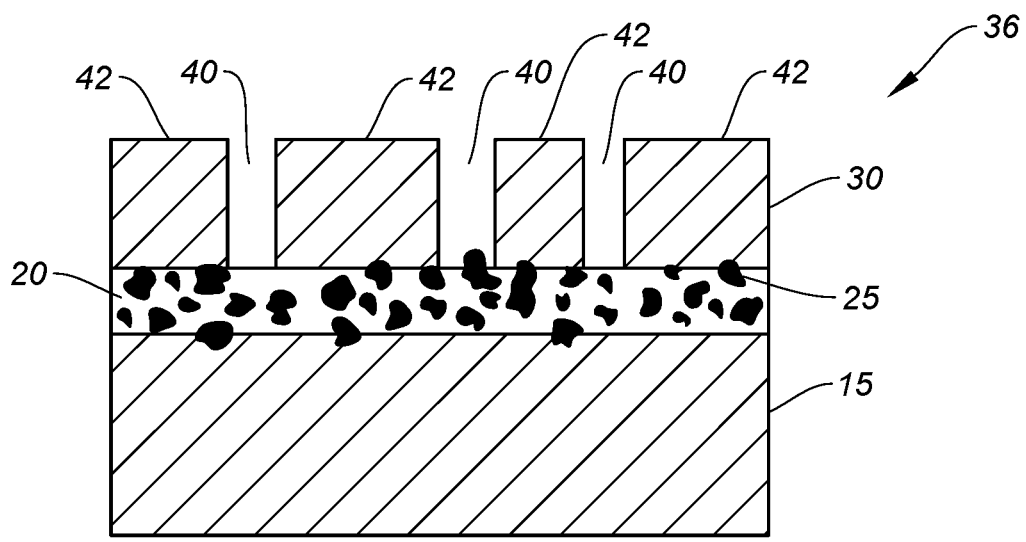
FIG. 1B is a cross-sectional schematic illustration of one embodiment of a mask element formed from the imageable material illustrated in FIG. 1A.

This exposing step is illustrated for some embodiments in FIG. 1A in which imageable material 10 is exposed to exposing infrared radiation 35 in an imagewise pattern to provide exposed regions 40 and non-exposed regions 42 as illustrated in mask element 36 shown in FIG. 1B and corresponding to a mask image.

The step of forming the mask image can also include a step of removing either exposed or non-exposed regions from the IL if desired. In some embodiments, exposed regions of the IL are removed for example by ablating away the exposed material(s) in the IL. In this mechanism, the exposed regions of the IL are removed from the mask element by the generation of a gas, leaving a mask image. Specific binders that decompose upon exposure to heat (such as that produced by IR laser irradiation) to rapidly generate a gas can be present in the IL. This action is to be distinguished from other mass transfer techniques in that a chemical rather than a physical change causes an almost complete transfer of the IL rather than a partial transfer.

In other embodiments not illustrated, a mask image can be formed on the carrier sheet (and LTHC layer disposed thereon) by producing exposed and non-exposed regions in the IL and selectively removing the non-exposed regions.

In some embodiments, the mask image in the IL of the mask element can be cured by subjecting it to heat treatment, provided that the properties of the mask element are not adversely affected. Heat treatment can be carried out by a variety of means including but not limited to, storage in an oven, hot air treatment, or contact with a heated platen or passage through a heated roller device. Heat treatment is not necessary for curing to take place.

In still other embodiments, a mask image can be formed as noted above and the exposed regions can be transferred to a receptor sheet that is then removed from the mask element before it is brought into contact with to a relief-forming precursor. Such procedures are well known in the art.

In a peel-apart imaging mechanism, the exposed regions of the IL can be removed from the carrier sheet (and LTHC layer disposed thereon) using a suitable receptor sheet based on differential adhesion properties in the IL. After imagewise exposure of the imageable material, the receptor sheet is separated from the carrier sheet and either exposed or non-exposed regions remain in the mask element.

Forming Relief Images

After a mask element is formed as described above, it is brought into complete optical contact with a suitable relief-forming precursor (described above) that is sensitive to curing UV radiation. This can be accomplished by placing the mask element onto the relief-forming precursor or vice versa, as described below in more detail, for example, using lamination equipment and process. Vacuum drawdown of the mask element onto the relief-forming precursor can also be carried out, with or without lamination, to achieve desired complete optical contact.

Some embodiments according to the present invention can be understood by reference to the general illustrations provided in the sequence of FIGS. 1A through 1E. As described above, FIG. 1A illustrates imageable material 10 that is exposed to exposing infrared radiation 35 to form mask element 36 (FIG. 1B).

Figure 1C:
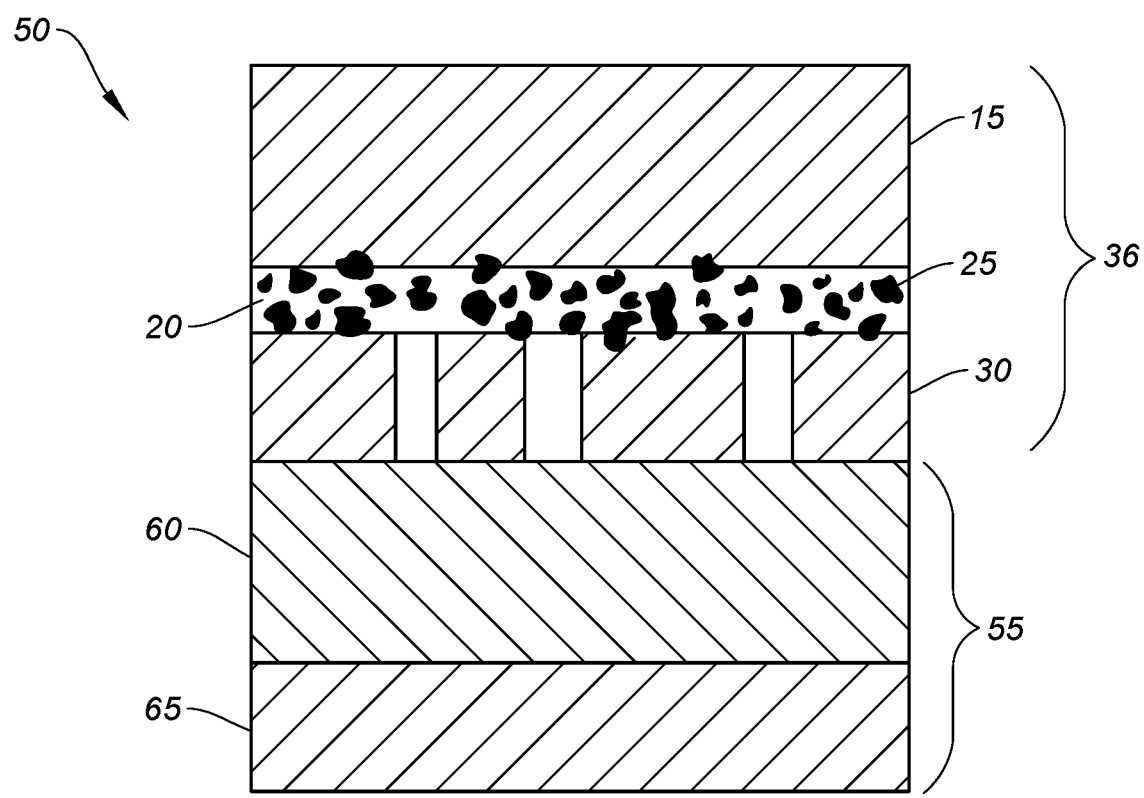
FIG. 1C is a cross-sectional schematic illustration of one embodiment of a relief image-forming assembly according to the present invention, comprising a mask element as illustrated in FIG. 1B that is in complete optical contact with a relief-forming precursor.
Figure 1D:
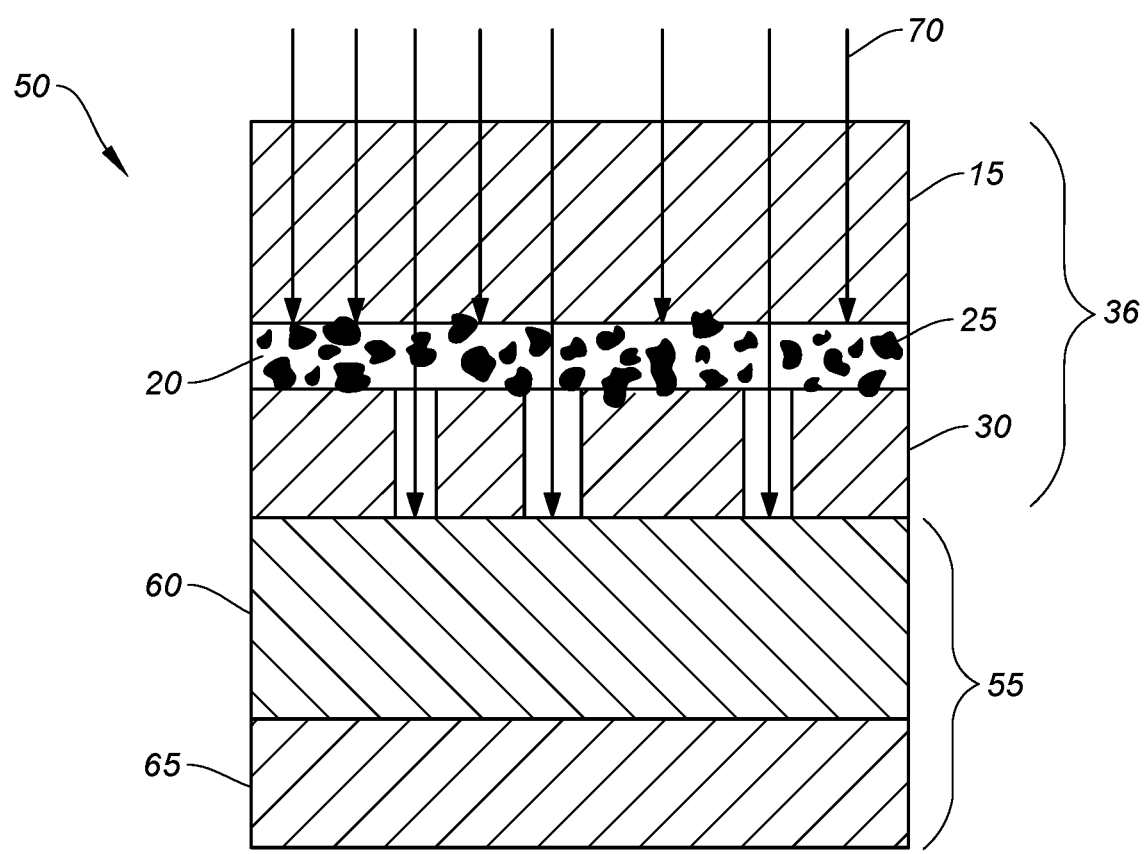
FIG. 1D is a cross-sectional schematic illustration of forming an imaged relief-forming precursor using incident UV radiation through the mask element illustrated in FIG. 1B.
Figure 1E:
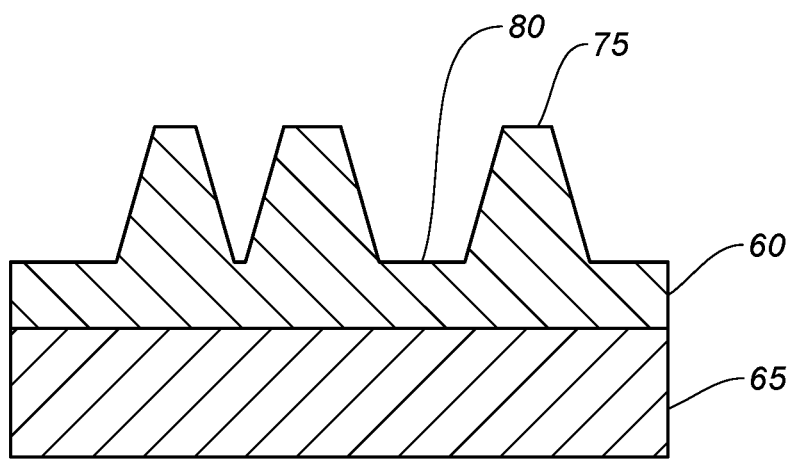
FIG. 1E is a cross-sectional schematic illustration of a relief image element provided after imaging illustrated in FIG. 1D and suitable development process to remove non-exposed regions in the UV-sensitive layer of the imaged relief-forming precursor.

In FIG. 1C, mask element 36 is shown in intimate or complete optical contact with relief-forming precursor 55 to provide relief-image forming assembly 50. Relief-forming precursor 55 includes UV-sensitive layer 60 that is typically carried on substrate 65.

Exposing UV radiation 70 is then used (FIG. 1D), passing through transparent polymeric carrier sheet 15, LTHC layer 20 and the exposed regions of IL 30 in mask element 36 to cause photocuring in UV-sensitive layer 60 of relief-forming precursor 55.

After UV-exposure, mask element 36 can be removed from the relief-forming precursor 55 and development can provide a relief image (FIG. 1E) in UV-sensitive layer 60, which relief image include relief image peaks 75 and relief image valleys 80.

Lamination:

As noted above, the mask element and relief-forming precursor can be placed in complete optical contact so as to provide an air-free interface at the shared interface. Generally, this is achieved by laminating the mask element to the UV-sensitive layer of the relief-forming precursor by applying suitable pressure or heat, or both pressure and heat to form an air-free or gap-free interface prior to UV exposure. However, if the relief-forming precursor includes a spacer (or anti-tack layer) as described above, the laminating procedure may be not needed. As noted above, vacuum drawdown of the masking element onto the relief-forming precursor can then be useful.

Commercially available laminators that provide both heat and uniform pressure can be used including but not limited to, KODAK model 800XL APPROVAL LAMINATOR available from Eastman Kodak Company (Rochester, NY). CODOR LPP650 LAMINATOR available from CODOR (Amsterdam, Holland), and LEDCO HD laminators available from Filmsource (Casselbury, Fla.) can also be useful. If a transparent polymeric overcoat layer is attached directly to the IL of the imageable material, it can be removed before lamination or other operations of forming complete optical contact of mask element with the relief-forming precursor. The relief-image forming assembly of the mask element and the relief-forming precursor can be fed into the laminator at a desired speed, temperature, and pressure.

Useful lamination (laminator) devices and methods for using them are described for example in U.S. Pat. No. 7,802,598 (Zwadlo et al.), the disclosure of which is incorporated herein by reference. As noted therein, a pre-press flexographic plate laminator can be used to laminate a mask element ("masking film") on a relief-forming precursor ("pre-press flexographic printing plate") by applying a balanced, non-distorting, optimized laminating force to achieve complete optical contact while minimizing lateral distortion.

In one embodiment, the relief-forming precursor does not have a separation, spacer, or anti-tack layer and pressure alone can be sufficient to achieve an air-free interface, as the UV-sensitive layer in the relief-forming precursor can be tacky, or act as a pressure sensitive adhesive, due to the presence of polymerizable monomers.

In still another embodiment, the mask element can be arranged by using a pressure-sensitive adhesion when it is pressed into contact with the relief-forming precursor to form an air-free interface. A pressure-sensitive adhesive can be incorporated into the outermost layer of the relief-forming precursor, or it can be placed in a spacer layer (described above). Suitable pressure-sensitive adhesives are known in the art.

In still another embodiment, the mask element can be transferred using what is known as a "liquid photopolymer process" in which a UV-sensitive composition is uniformly applied, in liquid or paste form, to the mask element containing the mask image, for example, by placing the UV-sensitive composition between the mask element and a transparent material that then becomes the "support" or substrate for the relief-forming precursor. For example, the transparent material can be a polymeric film as described above.

UV Exposure:

After complete optical contact has been achieved between the mask element and the relief-forming precursor as described above, the relief-forming precursor can be exposed to curing UV radiation through the mask element to form an imaged relief-forming precursor with exposed regions and non-exposed regions in the UV-sensitive layer. Thus, the uniformly emitted curing UV radiation is projected onto the relief-forming precursor through the mask image that preferentially blocks some of the ultraviolet radiation. In unmasked (exposed) regions, curing UV radiation will cause hardening or curing of the UV-sensitive composition(s) in the IL. The mask image is therefore substantially opaque to the exposing or curing UV radiation, meaning that the mask image should have a transmission optical density of 2 or more and typically 3 or more in the non-exposed regions. The unmasked (exposed) regions should be substantially transparent meaning that they should have a transmission optical density of 0.5 or less, or even 0.1 or less, and more typically at least 0.5 and up to and including 0.1 or at least 0.1 and up to and including 0.3. Transmission optical density can be measured using a suitable filter on a densitometer, for example, a MACBETH TR 927 densitometer.

Generally, exposure of the relief-forming precursor through the mask element is accomplished by floodwise exposure from suitable irradiation sources of UV radiation. Exposure can be carried out in the presence of atmospheric oxygen. Exposure under vacuum is not necessary as complete optical contact has already been made.

In the manufacture of a relief imaging element such as a flexographic printing plate, one side of the relief-forming precursor can be generally first exposed to curing UV radiation through its transparent substrate (known as "back exposure") to prepare a thin, uniform cured layer on the substrate side of the UV-sensitive layer. The relief-forming precursor is then exposed to curing UV radiation through the mask element containing the mask image, thereby causing the IL to harden or cure in the unmasked (exposed) regions. Unexposed and uncured regions of the UV-sensitive layer can then be removed by a developing process (described below), leaving the cured or hardened regions that define the relief image printing surface of a predetermined desired pattern of shapes and sizes of peaks and valleys. The back exposure can be performed either before or after complete optical contact is made between the mask element and the relief-forming precursor.

The wavelength or range of wavelengths suitable as the curing UV radiation will be dictated by the electromagnetic sensitivity of the relief-forming precursor. In some embodiments, the UV curing radiation can have one or more wavelengths in the range of at least 150 nm and up to and including 450 nm, or more typically of at least 300 nm and up to and including 450 nm. Sources of UV radiation for floodwise or overall exposure include but are not limited to, carbon arcs, mercury-vapor arcs, fluorescent lamps, electron flash units, and photographic flood lamps. UV radiation is particularly useful from mercury-vapor lamps and sun lamps. Representative UV radiation sources include SYLVANIA 350 BLACKLIGHT fluorescent lamp (FR 48T12/350 VL/VHO/180, 115 watts) that has a central emission wavelength of about 354 nm that is available from Topbulb (East Chicago, Ind.), and BURGESS EXPOSURE FRAME, Model 5K-3343VSII with ADDALUX 754-18017 lamp available from Burgess Industries, Inc. (Plymouth, Mass.).

Other suitable sources of UV radiation include platemakers that can be used to both expose the relief-forming precursor to radiation and to develop the imaged relief-forming material after radiation exposure. Examples of suitable platemakers include but are not limited to, KELLEIGH MODEL 310 PLATEMAKER available from Kelleigh Corporation (Trenton, N.J.) and the GPP500F PLATE PROCESSOR available from Global Asia Ltd. (Hong Kong).

The time for exposure through the mask element will depend upon the nature and thickness of the UV sensitive layer of the relief-forming precursor and the source of the and strength of the UV radiation. For example, in one of embodiment, a FLEXCEL-SRH plate precursor available from Eastman Kodak Company can be mounted on a KELLEIGH MODEL 310 PLATEMAKER and back exposed to UV-A radiation through the transparent support for about 20 seconds to prepare a thin, uniform cured layer on the support side of the relief-forming precursor. The relief image forming assembly of mask element and relief-forming precursor can then be exposed to UV radiation through the mask element for about 14 minutes. The mask image information is thus transferred to the relief-forming precursor (such as a flexographic plate precursor).

In general, the method can also comprise removing the mask element from complete optical contact with the imaged relief-forming precursor after exposing and before developing. This can be done using any suitable manner, such as peeling the two elements apart. For example, this can be accomplished by pulling the mask element away from the imaged relief-forming precursor.

Development:

The imaged relief-forming precursor is then generally developed with a suitable developer (or processing solution, or "washout solution") to form a relief image. Development serves to remove the non-exposed (uncured) regions of the UV-sensitive layer, leaving the exposed (cured) regions that define the relief image.

Any known organic solvent-based or aqueous-based developer can be used in this processing step including known developers that contain predominantly chlorinated organic solvents. However, other useful developers are predominantly non-chlorinated organic solvents. By "predominantly," it is meant that more than 50% (by volume) of the developer comprises one or more non-chlorinated organic solvents such as aliphatic hydrocarbons and long chain alcohols (that is alcohols with at least 7 carbon atoms). The remainder of the developers can be chlorinated organic solvents that are known in the art for this purpose.

Certain useful developers are predominantly what are known as "perchloroethylene alternative solvents" (PAS) that are generally volatile organic compounds typically comprised of mixtures of aliphatic hydrocarbons and long-chain alcohols. Examples of such commercially available solvents include but are not limited to, PLATESOLV available from Hydrite Chemical Co. (Brookfield, Wisc.), NYLOSOLV® available from BASF (Germany), FLEXOSOL® available from DuPont (Wilmington, Del.), OptiSol® available from DuPont (Wilmington, Del.), and SOLVIT° QD available from MacDermid (Denver, Colo.).

Other useful developers are described in U.S. Pat. No. 5,354,645 (Schober et al.), the disclosure of which is incorporated herein by reference, and include one or more of diethylene glycol dialkyl ethers, acetic acid esters or alcohols, carboxylic acid esters, and esters of alkoxy substituted carboxylic acids. Still other useful developers are described in U.S. Pat. No. 6,162,593 (Wyatt et al) described developers comprising diisopropylbenzene (DIPB), 5,248,502 (Eklund), U.S. Pat. No. 6,248,502 (Eklund), the disclosures of all of which are incorporated herein by reference.

Additional useful developers are described in U.S. Pat. No. 6,582,886 (Hendrickson et al.), the disclosure of which is incorporated herein by reference, and contain methyl esters alone or mixtures of methyl esters and co-solvents such as various alcohols that are soluble in the methyl ester(s).

U.S. Patent Application Publication 2010/0068651 (Bradford) describes useful developers containing dipropylene glycol dimethyl ether (DME) alone or in combination with various co-solvents such as alcohols and aliphatic dibasic acid ethers. The disclosure of this publication is incorporated herein by reference.

Still other useful developers are described in U.S Patent Application Publication 2011/0183260 (Fohrenkamm et al.), the disclosure of which is incorporated herein by reference. Such developers can comprise:

a. one or more esters of monobasic carboxylic acids represented by one or both of the following Structures (I) and (II):

$$R_1-C(=O)O-(CH_2)_n-Ar_1 \qquad (I)$$

wherein $R_1$ is an alkyl group having 1 to 5 carbon atoms, $Ar_1$ is a substituted or unsubstituted phenyl or naphthyl group, and n is 1 to 3, and $$H-C(=O)OR \qquad (II)$$

wherein R is a hydrocarbon having 6 to 15 carbon atoms, and b. one or more aliphatic alcohols, or a combination of one or more aliphatic alcohols and one or more aromatic alcohols.

Specific developers of this type consist essentially of:

a. from about 5 to about 70 weight % of benzyl acetate or propionate, b. from about 5 to about 40 weight % of 2-ethylhexyl alcohol, octyl alcohol, or benzyl alcohol, and c. from about 5 to about 50 weight % of a petroleum distillate.

Other useful developers are described in U.S. Pat. No. 8,771,925 (Fohrenkamm et al.), the disclosure of which is incorporated herein by reference, which developer include diisopropylbenzene and one or more organic co-solvents, one of which is an aliphatic dibasic acid ester.

Still other useful developers are described in U.S. Pat. No. 9,005,884 (Yawata et al.), the disclosure of which is incorporated herein by reference, which processing solution can include an alkali metal salt of a saturated fatty acid having a carbon number of 12 to 18 and an alkali metal salt of an unsaturated fatty acid having a carbon number of 12 to 18 in a weight ratio of from 20:80 to 80:20 of the first fatty acid salt to the second fatty acid salt.

Still other useful developers are described in copending and commonly assigned U.S. Ser. No. 15/352,663 (filed Nov. 16, 2016 by Ollmann, Jr., Fohrenkamm, and Mellema), the disclosure of which is incorporated herein by reference. Such flexographic developers can comprise: a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of at least 0.25 weight % and up to and including 2.0 weight %, and at least 85 weight % of the fatty acid composition is composed of one or more $C_{18}$ mono- or poly-unsaturated fatty acids or alkali metal salts thereof; b) an aminopolycarboxylic acid or alkali metal salt thereof in an amount of at least 0.05 weight % and up to and including 0.30 weight %; c) a buffer compound in an amount of at least 05 weight % and up to and including 0.60 weight %; and d) water.

Development can be carried out under known conditions such as for at least 1 minute and up to and including 20 minutes and at a temperature of at least 20° C. and up to and including 32° C. The type of developing apparatus and specific developer that are used will dictate the specific development conditions and can be adapted by a skilled worker in the art.

Post-development processing of the relief image in the imaged relief-forming precursor can be suitable under some circumstances. Typical post-development processing includes drying the relief image to remove any excess solvent and post-curing by exposing the relief image to curing radiation to cause further hardening or crosslinking. The conditions for these processes are well known to those skilled in the art. For example, the relief image can be blotted or wiped dry, or dried in a forced air or infrared oven. Drying times and temperatures would be apparent to a skilled artisan. Post-curing can be carried out using the same type of UV-radiation previously used to expose the relief-forming precursor through the imaged mask material.

Detackification (or "light finishing") can be used if the relief image surface is still tacky. Such treatments, for example, by treatment with bromide or chlorine solutions or exposure to UV or visible radiation, are well known to a skilled artisan.

The resulting relief image can have a depth of at least 2% and up to and including 100% of the original thickness of the UV-sensitive layer (for example, if this layer is disposed on a substrate). For a flexographic printing plate, the maximum dry depth of the relief image can be from at least 150 μm and up to and including 1000 μm, or typically at least 200 μm and up to and including 500 μm. For a printed circuit board, the UV-sensitive layer can be completely removed in either the exposed or non-exposed regions, to reveal the metal layer underneath. In such elements, the maximum depth of the relief image depends upon the dry thickness of the UV-sensitive layer. Advantageously, in any embodiment, the relief image can have shoulder angles of greater than 50°.

Thus, in some embodiments, the method is carried out wherein the relief-forming precursor is a UV-sensitive flexographic printing plate precursor and imaging and developing it such precursor to provide a flexographic printing plate. Similarly, letterpress printing plates can be prepared from the appropriate precursor elements.

The relief images obtained according to the present invention can be suitably "inked" with any desirable composition that can then be printed onto a suitable substrate or receiver element. One skilled in the art can readily see the various utilities that such inked elements would have in various industries including the flexographic printing of various packaging materials.

The present invention provides at least the following embodiments and combinations thereof, but other combinations of features are considered to be within the present invention as a skilled artisan would appreciate from the teaching of this disclosure:

1. A method for making a relief image in a relief image element, the method comprising, in order:

A) imaging an imageable material to form a mask element;

B) exposing a relief-forming precursor comprising a UV-sensitive layer with curing radiation through the mask element, to form an imaged relief-forming precursor with exposed hardened regions and non-exposed regions in the UV-sensitive layer, C) removing the mask element; and D) developing the imaged relief-forming precursor by removing the non-exposed regions in the UV-sensitive layer, thereby forming a relief image element having a relief image, the imageable material consisting essentially of, in order:

(a) a transparent polymeric carrier sheet;

(b) a non-ablatable light-to-heat converting (LTHC) layer disposed directly on the transparent polymeric carrier sheet, the LTHC layer having an average dry thickness of at least 1 μm and up to and including 5 μm, and comprising: (i) a first infrared radiation absorbing material in an amount of at least 0.1 weight % and up to and including 5 weight %; (ii) a thermally crosslinked organic polymeric binder material; and (iii) non-thermally ablatable particles having an average particle size of at least 0.1 μm and up to and including 20 μm and that are present in an amount of at least 0.2 weight % and up to and including 10 weight %, all weight percentages being based on the total dry weight of the LTHC layer;

(c) a non-silver halide thermally-ablatable imaging layer (IL) disposed directly on the LTHC layer, the IL comprising a second infrared radiation absorbing material and a UV-light absorbing material dispersed within one or more thermally-ablatable polymeric binder materials; and the imageable material optionally further comprising (d) a transparent polymeric overcoat layer disposed directly on the IL.

2. The method of embodiment 1, wherein in B), the mask element is in complete optical contact with the relief-forming precursor.

3. The method of embodiment 1 or 2, wherein B) further includes vacuum drawdown of the mask element onto the relief-forming precursor.

4. The method of any of embodiments 1 to 3, wherein developing is carried out using a processing solution comprising diisopropylbenzene and one or more organic co-solvents as least one of which is an aliphatic dibasic acid ester.

5. The method of any of embodiments 1 to 4, wherein developing is carried out using a processing solution comprising a) a fatty acid composition consisting of one or more saturated or unsaturated fatty acids or alkali metal salts thereof, each saturated or unsaturated fatty acid or alkali metal salts thereof independently having 12 to 20 carbon atoms, the fatty acid composition being present in an amount of at least 0.25 weight % and up to and including 2.0 weight %, and at least 85 weight % of the fatty acid composition is composed of one or more C18 mono- or poly-unsaturated fatty acids or alkali metal salts thereof; b) an aminopolycarboxylic acid or alkali metal salt thereof in an amount of at least 0.05 weight % and up to and including 0.30 weight %; c) a buffer compound in an amount of at least 05 weight % and up to and including 0.60 weight %; and d) water.

6. The method of any of embodiments 1 to 5, wherein the curing radiation is UV radiation having an electromagnetic radiation wavelength of at least 300 nm and up to and including 450 nm.

7. The method of any of embodiments 1 to 6, wherein A) imaging the imageable material is carried out using a near-infrared laser at an electromagnetic radiation wavelength of a least 700 nm and up to and including 1400 nm.

8. The method of any of embodiments 1 to 7, comprising laminating the mask element to the relief-forming precursor prior to B).

9. A relief image-forming assembly, consisting essentially of:
a mask element in complete optical contact with a relief-forming precursor comprising a UV-sensitive layer,
the mask element derived by imaging an imageable material consisting essentially of, in order:
(a) a transparent polymeric carrier sheet;
(b) a non-ablatable light-to-heat converting (LTHC) layer disposed directly on the transparent polymeric carrier sheet, the LTHC layer having an average dry thickness of at least 1 μm and up to and including 5 μm, and comprising: (i) a first infrared radiation absorbing material in an amount of at least 0.1 weight % and up to and including 5 weight percent; (ii) a thermally crosslinked organic polymeric binder material; and (iii) non-thermally ablatable particles having an average particle size of at least 0.1 μm and up to and including 20 μm and that are present in an amount of at least 0.2 weight % and up to and including 10 weight %,
all weight percentages being based on the total dry weight of the LTHC layer;
(c) a non-silver halide thermally-ablatable imaging layer (IL) disposed directly on the LTHC layer, the IL comprising a second infrared radiation absorbing material and a UV-light absorbing material dispersed within one or more thermally-ablatable polymeric binder materials; and
the imageable material optionally further comprising (d) a transparent polymeric overcoat layer disposed directly on the IL.

10. The assembly of embodiment 9, wherein the mask element and relief-forming precursor are held in complete optical contact with a laminator.

11. The assembly of embodiment 9 or 10, wherein the mask element and relief-forming precursor are held in complete optical contact with a laminator that provides a balanced, non-distorting, optimized laminating force.

12. The assembly of any of embodiments 9 to 11, wherein the mask element and relief-forming precursor are held in complete optical contact using vacuum drawdown.

13. Any of the embodiments 1 to 12, wherein the one or more thermally-ablatable polymeric binder materials in the IL are nitrocellulose, a poly(cyanoacrylate), or a combination thereof 14. Any of the embodiments 1 to 13, wherein the second infrared radiation absorbing material is present in the IL in an amount of at least 3 weight % and up to and including 20 weight %, based on the total dry weight of the IL.

15. Any of the embodiments 1 to 14, wherein the UV-light absorbing material is present in the IL in an amount of at least 10 weight % and up to and including 40 weight %, based on the total dry weight of the IL.

16. Any of the embodiments of embodiments 1 to 15, wherein the transparent polymeric carrier sheet is composed of one or more polyesters, polyethylene-polypropylene copolymers, polybutadienes, polycarbonates, polyacrylates, vinyl chloride polymers, hydrolyzed or non-hydrolyzed cellulose acetates, or a combination of two or more of these materials.

17. Any of the embodiments 1 to 16, wherein the non-thermally ablatable particles in the LTHC layer are composed of particles of silica, titanium dioxide, zinc oxide, or a combination of two or more types of such particles.

18. Any of embodiments 1 to 17, wherein the non-thermally ablatable particles are present in the LTHC layer in an amount of at least 1 weight % and up to and including 7 weight %, based on the total dry weight of the LTHC layer.

19. Any of embodiments 1 to 18, wherein the thermally crosslinked organic polymeric binder material in the LTHC layer is composed of crosslinked nitrocellulose, a crosslinked polyester, or a combination of two or more of such crosslinked organic polymeric materials.

20. Any of embodiments 1 to 19, wherein the first and second infrared radiation absorbing materials are the same materials.

21. Any of embodiments 1 to 20, wherein the LTHC layer has an average dry thickness of at least 1 μm and up to and including 3 μm.

22. Any of embodiments 1 to 21, wherein the IL has an average dry thickness of at least 0.5 μm and up to and including 5 μm.

23. Any of embodiments 1 to 22, wherein the relief-forming precursor further comprises an anti-tack layer disposed on the UV-sensitive layer.

The following Examples are provided to illustrate the practice of this invention and are not meant to be limiting in any manner.

The materials used in the following examples were as follows: Alchemix 2340 polyester resin was obtained from Alchemix;

CBlk 15B532 Paste is a mixture of carbon black and nitrocellulose and was obtained from Penn Color;

Capstone® FS-22 is fluorosurfactant and was obtained from DuPont;

Capstone® FS-3100 is a fluorosurfactant and was obtained from DuPont;

Curcumin is a yellow dye that can be obtained from Cayman Chemicals (Ann Arbor, Mich.);

114444 FN-D89 Nitroso cyan dye was obtained from Eastman Kodak Company (CAS #4899-82-5);

Desmodur® ILBA crosslinking agent was obtained from Convestro;

Dispersbyk® 182 dispersing agent was obtained from Byk Chemie;

EMAX is an acrylic solution provided by Eastman Kodak Company (product code 10083590);

Fluoro™ AQ-50 is a fluorochemical dispersion and was obtained from Shamrock Technologies;

Hydrocerf 9174 is a polytetrafluoroethylene wax and was obtained from Shamrock Technologies;

IR Dye 1 is an infrared radiation absorbing material (830 nm sensitivity) and has the structure shown at the bottom of Cols. 5 and 6 of U.S. Pat. No. 5,759,741 (Pearce et al.), the disclosure of which is incorporated herein by reference;

IR Dye 1421 is an infrared radiation absorbing material (1064 nm sensitivity, tetrakis ammonium type) and was obtained from Adam Gates;

IR Dye IRT is an infrared radiation absorbing material (830 nm sensitivity) and was commercially obtained from Showa Denko (CS No. 96233-24-8);

Keyplast™ Yellow GC is a yellow dye and was obtained from Keystone Aniline Corporation;

MEK represents methyl ethyl ketone;

MIBK represents methyl isobutyl ketone;

Nitrocellulose E150 (5 weight % in MIBK) was obtained from Scholle;

Poly(cyanoacrylate) was prepared by Eastman Kodak Company;

"Solv PM" (or Arcosolv® PM) represents (mono)propylene glycol (mono methyl ether;

Solvent Yellow 93 is a dye and was obtained from Keystone Aniline Corporation;

Syloid® C-810 PM ("premix") contained 0.46 g of Syloid® C-810 amorphous silica powder (from Grace), 0.05 g of Disperbyk® 182 dispersing agent, and 9.5 g of cyclopentanone; and Tyzor® AA75 is a titanium acetylacetonate chelate cross-linking agent and was obtained from Dorf Ketal.

Other organic solvents used in the coating formulations were readily commercially available.

Comparative Example 1

An imageable material outside the scope of the present invention was prepared in the following manner and having the followed layer structure:

A "barrier layer" was formed on a poly(ethylene terephthalate) film (PET) that was used as a transparent polymeric carrier sheet. This barrier layer can serve as a LTHC layer but it contained no non-thermally ablatable particles that are required in the imageable materials according to the present invention.

This barrier layer was formed by applying the coating formulation in TABLE I to the PET using an 8 Meyer bar at 80 mg/ft² (784 mg/m²) followed by 2 minutes drying at 100° C.

TABLE I

| Barrier Layer Formulation Components | Parts |
| --- | --- |
| Poly(cyanoacrylate) | 5.508 |
| IR Dye IRT | 0.072 |
| Syloid ® C-810 PM | 8.235 |
| Cyclopentanone | 31.185 |
| Acetone | 35.000 |
| Acetonitrile | 20.000 |
| | 100 |

A UV-sensitive, non-silver halide thermally-ablatable imaging layer (IL) was formed on the dried barrier layer by applying the coating formulation in TABLE II using a 14 Meyer bar at 165 mg/ft² (1617 mg/m²), followed by drying for 2 minutes at 100° C.

TABLE II

| UV-Sensitive Formulation Components | Parts |
| --- | --- |
| Curcumin | 0.48 |
| Keyplast ™ Yellow GC | 0.86 |
| 114444 FN-D89 Nitroso cyan dye | 0.20 |
| Solvent Yellow 93 | 0.20 |
| CBlk 15B532 Paste | 2.27 |
| Nitrocellulose E150 | 46.37 |
| IR Dye IR-1 | 0.78 |
| MIBK | 28.84 |
| MEK | 20.00 |
| | 100 |

A transparent polymeric overcoat layer was formed on the UV-sensitive non-silver halide thermally-ablatable imaging layer by applying the coating formulation in TABLE III using a 12 Meyer bar at 14 mg/ft² (137 mg/m²), followed by drying for 2 minutes at 100° C.

TABLE III

| Overcoat Layer Formulation Components | Parts |
| --- | --- |
| EMAX | 9.89 |
| Hydrocerf 9174 | 0.21 |
| Fluoro ™ AQ-50 | 0.49 |
| Capstone ® FS-3100 | 0.03 |
| Water | 89.38 |
| | 100 |

Comparative Example 2

An imageable material was prepared outside of the present invention, containing no barrier layer or LTHC layer. A UV-sensitive non-silver halide thermally ablatable imaging layer (IL) was formed directly on a PET film by applying the coating formulation shown in TABLE IV using a 14 Meyer bar at 165 mg/ft² (1617 mg/m²), followed by drying for 2 minutes at 100° C.

TABLE IV

| UV-Sensitive Formulation Components | Parts |
| --- | --- |
| CBlk 15B532 Paste | 9.05 |
| Nitrocellulose E150 | 36.14 |
| IR Dye IR-1 | 1.12 |
| MIBK | 27.16 |
| MEK | 20.00 |
| Capstone ® FS-22 | 0.10 |
| Syloid ® C-810 PM | 6.43 |
| | 100 |

A transparent polymeric overcoat layer was formed on this UV-sensitive non-silver halide thermally-ablatable imaging layer by applying the coating formulation in TABLE III using a 12 Meyer bar at 14 mg/ft² (137 mg/m²), followed by drying for 2 minutes at 100° C.

Invention Example 1

An imageable material was prepared according to the present invention by forming a LTHC layer according to the present invention on a PET film as a transparent polymeric carrier sheet. The LTHC layer was formed by applying the coating formulation shown in TABLE V using a 30 Meyer bar at 145 mg/ft$^2$ (1421 mg/m$^2$) followed by drying for 2 minutes at 100° C.

TABLE V

| LTCH Formulation Components | Parts |
|---|---|
| Syloid ® C-810 PM | 0.75 |
| Nitrocellulose E150 | 54.79 |
| IR Dye IR-1 | 0.04 |
| MIBK | 4.42 |
| Ethanol | 20.00 |
| "Solv PM" | 20.00 |
| | 100 |

A UV-sensitive non-silver halide thermally ablatable imaging layer (IL) was formed over this LTHC layer using the same coating formulation described in TABLE IV of Comparative Example 2, followed by drying for 2 minutes at 100° C.

A transparent polymeric overcoat layer was then formed over the IL using the same coating formulation as described in TABLE III of Comparative Example 1, followed by drying for 2 minutes at 100° C.

Invention Example 2

Another imageable material was prepared according to the present invention and similarly to that of Invention Example 1, but the IL was formed by applying the coating formulation described in TABLE VI as described in Comparative Example 2, followed by drying for 2 minutes at 100° C.

TABLE VI

| UV-Sensitive Formulation Components | Parts |
|---|---|
| CBlk 15B532 Paste | 9.051 |
| Nitrocellulose E150 | 36.140 |
| IR Dye IR-1 | 1.118 |
| MIBK | 33.591 |
| MEK | 20.000 |
| Capstone ® FS-22 | 0.10 |
| | 100 |

A transparent polymeric overcoat layer was then formed over the IL using the same coating formulation as described in TABLE III of Comparative Example 1, followed by drying for 2 minutes at 100° C.

Invention Example 3

An imageable material was prepared according to the present invention and similarly to that described in Invention Example 1, except that Desmodur® ILBA crosslinking agent was included in the LTHC layer in an amount of 17% of total solids of the coating formulation (and eventual dried layer) that is shown below in TABLE VII.

TABLE VII

| LTCH Formulation Components | Parts |
|---|---|
| Syloid ® C-810 PM | 1.5 |
| Nitrocellulose E150 | 46.28 |
| Desmodur ® ILBA | 7.76 |
| IR Dye IR-1 | 0.04 |
| MIBK | 4.42 |
| Ethanol | 20 |
| "Solv PM" | 20 |
| | 100 |

Invention Example 4

An imageable material was prepared according to the present invention and similarly to Invention Example 3 except that Alchemix 2340 polyester resin was incorporated into the LTHC layer in an amount of 22% of total solids of the coating formulation (and eventual dried layer) that is shown below in TABLE VIII.

TABLE VIII

| LTCH Formulation Components | Parts |
|---|---|
| Syloid ® C-810 PM | 2 |
| Nitrocellulose E150 | 44.205 |
| Desmodur ® IL BA | 7.76 |
| Alchemix 2340 | 1.575 |
| IR Dye IR-1 | 0.04 |
| MIBK | 4.42 |
| Ethanol | 20 |
| "Solv PM" | 20 |
| | 100 |

Invention Example 5

An imageable material was prepared according to the present invention and similarly to Invention Example 4 except that Tyzor AA75 was incorporated into the LTHC layer in an amount of 7% of total solids of the coating formulation (and eventual dried layer) that is shown below in TABLE IX.

TABLE IX

| LTCH Formulation Components | Parts |
|---|---|
| Syloid ® C-810 PM | 2.25 |
| Nitrocellulose E150 | 41.13 |
| Desmodur ® IL BA | 7.76 |
| Alchemix 2340 | 1.40 |
| Tyzor ® AA 75 | 3.00 |
| IR Dye IR-1 | 0.04 |
| MIBK | 4.42 |
| Ethanol | 20 |
| "Solv PM" | 20 |
| | 100 |

Invention Example 6

An imageable material was prepared according to the present invention and similarly to Invention Example 5 except that the two different IR dyes were replaced with IR dye 1421 in both the IL and LTHC layer.

Imaging Tests:

Except where noted below, imaging tests were carried out with the imageable materials described above using a Kodak Trendsetter imager at Conditions #1-#6 and an optimal drum speed on the imager to give consistent Dmin results. Imaging was carried out at a laser power of 700-900 mJ/cm².

All imageable materials of Invention 1-6 and Comparative Example 2 were used to provide mask elements having a $D_{max}$>3.0 and $D_{min}$ of about 0.10. which are very acceptable $D_{max}$ and $D_{min}$ values needed to achieve adequate flexographic printing plate (relief-forming precursor) exposure levels to provide uniform floor and "hilite" printing plate capabilities.

For the imageable material of Comparative Example 2, containing the particles in the IL, most of the particles were removed during laser ablation imaging to form the mask element. Furthermore, in this embodiment, the IL $D_{max}$ was reduced to below 3.0 TOD.

The imageable material of Invention Example 6 was imaged on an ESKO CDI imager at a laser wavelength of 1064 nm and laser power at 1.0-1.2 J/cm². The mask element so prepared showed a $D_{max}$>3.0 and $D_{min}$ of about 0.10 with excellent "hilite" retention capabilities.

Vacuum Draw-down Test:

The imageable material prepared in Invention Example 4 was compared to a commercially available Kodak DITR imaging film in a vacuum draw-down test, as follows:

A standard vacuum bell jar was used with each imageable material as the seal for the vacuum to the jar. The imageable material was positioned between the lid and the base of the vacuum bell jar. The surface of the jar and lid were cleaned with acetone before each imageable material was tested. For each imageable material, a 15.5-inch (39.4 cm) square was tested, each having 2.5 inch (6.35 cm) diameter hole to provide equal vacuum in each test. A vacuum pump was used to pull a vacuum to about −600 mm Hg (−23.6 inch). The vacuum hose was replaced with a vacuum gauge and the change in vacuum was evaluated after 10 minutes. The results are shown below in TABLE X.

TABLE X

| Imageable Material | Vacuum (initial in inches) | Vacuum (initial in mm) | Vacuum (after 10 minutes in inches) | Vacuum (after 10 minutes in mm) | % Change |
|---|---|---|---|---|---|
| DITR Film | −22.5 | −572 | −21 | −533 | −6.7 |
| Invention Example 4 | −22.5 | −572 | −17.5 | −445 | −22.2 |

Since the Invention Example 4 imageable material showed a greater change in the vacuum than the commercial imageable material, the imageable material according to the present invention would be more readily drawn down in a vacuum frame exposure process that can be used during the formation of a relief image according to the present invention.

Mask Element Delamination Test:

Mask elements were prepared as described above using the imageable materials described for Comparative Example 1 and Invention Example 1. These two mask elements (C-1 and I-1, respectively) were then used to prepare imaged letterpress printing plates using letterpress printing plate precursors (Kodak Rigilon TFPP) as relief-forming precursors. The exposure frame bed was preheated with UV lamps to 40-45° C. and UV exposures of each letterpress printing plate precursor through each mask element in the respective relief-image forming assemblies were carried out for 300 seconds.

It was found that after this exposure, mask element C-1 could not be removed from the exposed relief-forming precursor without delamination (or separation) of the various layers in mask element C-1 and thus barrier layer material from C-1 was left on the imaged relief-forming precursor. In contrast, mask element I-1 was easily removed from the imaged relief-forming precursor and thus the mask element could be re-used for further relief image formation.

This result shows the advantage of having a LTHC layer in the imageable material according to the present invention. The "barrier layer" composition and structure in mask element C-1 was not sufficient to prevent layer delamination.

Organic Solvent Resistance Test:

A test was carried out to compare the various LTHC layers in the invention imageable materials for solvent resistance. This test consisted of rubbing each imageable material 10 times back and forth with a cotton-tipped swab that had been soaked with the test organic solvent. The results are shown in the following TABLE XI.

TABLE XI

| Imageable Material | Resistance to MIBK | Resistance to MEK |
|---|---|---|
| Invention Example 1 | Poor | Poor |
| Invention Example 3 | Fair | Poor |
| Invention Example 4 | Good | Poor |
| Invention Example 5 | Very good | Fair |

These results show that improved chemical resistance increased with an increase in the degree of crosslinking in the LTHC layer as shown with Invention Examples 3-5. However, this does not mean that the imageable material of Invention Example 1 is not useful in provide relief images. These data merely show that different physical characteristics can be built into the imageable material by appropriate modifications of the LTHC layer composition.

Lamination Test:

The imageable material of Inventive Example 5 was compared to an Imaging Material that contained no particulate in a LTHC layer (as shown in Comparative Example 1) in a lamination test using a Kodak Flexcel NX laminator. The imageable material of Invention Example 5 was easily laminated to a commercially available Kodak Flexcel NXH 170 plate as the relief-forming precursor. However, the Comparative Example 1 imageable material could not easily be laminated to the relief-forming precursor and there was interfacial bubble formation in the relief-image forming assembly. These bubbles were difficult to remove even after smoothing the laminated elements in the relief-image forming assembly several times by hand. Thus, forming complete optical contact was not achieved.

These results show that the imageable materials prepared according to the present invention exhibit improved lamination characteristics (such as complete optical contact) during the formation of relief images.

The invention has been described in detail with particular reference to certain preferred embodiments thereof, but it will be understood that variations and modifications can be affected within the spirit and scope of the invention.

PARTS LIST

10 Imageable material
15 Transparent polymeric carrier sheet
20 Non-ablatable light-to-heat-converting (LTHC) layer
25 Non-thermally ablatable particles
30 Non-silver halide thermally-ablatable imaging layer (IL)
35 Exposing infrared radiation
36 Mask element
40 Exposed regions
42 Non-exposed regions
50 Relief-image forming assembly
55 Relief-forming precursor
60 UV-sensitive layer
65 Substrate
70 Exposing UV radiation
75 Relief image peaks
80 Relief image valleys

The invention claimed is:

1. A method for making a relief image in a relief image element, the method comprising, in order:
   A) imaging an imageable material with infrared radiation to form a mask element;
   B) exposing a relief-forming precursor comprising a UV-sensitive layer with curing UV radiation through the mask element, to form an imaged relief-forming precursor with exposed hardened regions and non-exposed regions in the UV-sensitive layer,
   C) removing the mask element; and
   D) developing the imaged relief-forming precursor by removing the non-exposed regions in the UV-sensitive layer, thereby forming a relief image element having a relief image,
   wherein the imageable material consisting essentially of, in order:
   (a) a transparent polymeric carrier sheet;
   (b) a non-ablatable light-to-heat converting (LTHC) layer disposed directly on the transparent polymeric carrier sheet, the LTHC layer having an average dry thickness of at least 1 um and up to and including 5 μm, and comprising: (i) a first infrared radiation absorbing material in an amount of at least 0.1 weight % and up to and including 5 weight %; (ii) a thermally crosslinked organic polymeric binder material; and (iii) non-thermally ablatable particles having an average particle size of at least 0.1 μm and up to and including 20 μm and that are present in an amount of at least 0.2 weight % and up to and including 10 weight %, all weight percentages being based on the total dry weight of the LTHC layer;
   all weight percentages being based on the total dry weight of the LTHC layer;
   (c) a non-silver halide thermally-ablatable imaging layer (IL) disposed directly on the LTHC layer, the IL comprising a second infrared radiation absorbing material and a UV-light absorbing material dispersed within one or more thermally-ablatable polymeric binder materials; and
   the imageable material optionally further comprising (d) a transparent polymeric overcoat layer disposed directly on the IL.

2. The method of claim 1, wherein in B), the mask element is in complete optical contact with the relief-forming precursor.

3. The method of claim 1, wherein B) further includes vacuum drawdown of the mask element onto the relief-forming precursor.

4. The method of claim 1, wherein the one or more thermally-ablatable polymeric binder materials in the IL are nitrocellulose, a poly(cyanoacrylate), or a combination thereof.

5. The method of claim 1, wherein the second infrared radiation absorbing material is present in the IL in an amount of at least 3 weight % and up to and including 20 weight %, based on the total dry weight of the IL.

6. The method of claim 1, wherein the UV-light absorbing material is present in the IL in an amount of at least 10 weight % and up to and including 40 weight %, based on the total dry weight of the IL.

7. The method of claim 1, wherein the transparent polymeric carrier sheet is composed of one or more polyesters, polyethylene-polypropylene copolymers, polybutadienes, polycarbonates, polyacrylates, vinyl chloride polymers, hydrolyzed or non-hydrolyzed cellulose acetates, or a combination of two or more of these materials.

8. The method of claim 1, wherein the non-thermally ablatable particles in the LTHC layer are composed of particles of silica, titanium dioxide, zinc oxide, or a combination of two or more types of such particles.

9. The method of claim 1, wherein the non-thermally ablatable particles are present in the LTHC layer in an amount of at least 1 weight % and up to and including 7 weight %, based on the total dry weight of the LTHC layer.

10. The method of claim 1, wherein the thermally crosslinked organic polymeric binder material in the LTHC layer is composed of crosslinked nitrocellulose, a crosslinked polyester, or a combination of two or more of such crosslinked organic polymeric materials.

11. The method of claim 1, wherein the first and second infrared radiation absorbing materials are the same materials.

12. The method of claim 1, wherein the LTHC layer has an average dry thickness of at least 1 μm and up to and including 3 μm.

13. The method of claim 1, wherein the IL has an average dry thickness of at least 0.5 μm and up to and including 5 μm.

14. The method of claim 1, wherein developing is carried out using a processing solution comprising a) a fatty acid composition consisting of one or more saturated or unsaturated fatty acids or alkali metal salts thereof, each saturated or unsaturated fatty acid or alkali metal salts thereof independently having 12 to 20 carbon atoms, the fatty acid composition being present in an amount of at least 0.25 weight % and up to and including 2.0 weight %, and at least 85 weight % of the fatty acid composition is composed of one or more C18 mono- or poly-unsaturated fatty acids or alkali metal salts thereof; b) an aminopolycarboxylic acid or alkali metal salt thereof in an amount of at least 0.05 weight % and up to and including 0.30 weight %; c) a buffer compound in an amount of at least 05 weight % and up to and including 0.60 weight %; and d) water.

15. The method of claim 1, comprising laminating the mask element to the relief-forming precursor prior to B).

16. The method of claim 1, wherein the relief-forming precursor further comprises an anti-tack layer disposed on the UV-sensitive layer.

17. A relief image-forming assembly, consisting essentially of:
   a mask element in complete optical contact with a relief-forming precursor comprising a UV-sensitive layer, the mask element having a mask image, the mask element consisting essentially of, in order:
(a) a transparent polymeric carrier sheet;
(b) a non-ablatable light-to-heat converting (LTHC) layer disposed directly on the transparent polymeric carrier sheet, the LTHC layer having an average dry thickness of at least 1 μm and up to and including 5 nm, and comprising: (i) a first infrared radiation absorbing material in an amount of at least 0.1 weight % and up to and including 5 weight percent; (ii) a thermally crosslinked organic polymeric binder material; and (iii) non-thermally ablatable particles having an average particle size of at least 0.1 nm and up to and including 20 nm and that are present in an amount of at least 0.2 weight % and up to and including 10 weight %, all weight percentages being based on the total dry weight of the LTHC layer;
(c) a non-silver halide thermally-ablatable imaging layer (IL) disposed directly on the LTHC layer, a non-ablated portion of the IL comprising a second infrared radiation absorbing material and a UV-light absorbing material dispersed within one or more thermally-ablatable polymeric binder materials, wherein at least a portion of the IL layer is an ablated portion and at least a portion of the IL layer is the non-ablated portion; and
the imageable material optionally further comprising (d) a transparent polymeric overcoat layer disposed directly on the IL.

18. The assembly of claim 17, wherein the mask element and relief-forming precursor are held in complete optical contact with a laminator.

19. The assembly of claim 18, wherein the mask element and relief-forming precursor are held in complete optical contact with a laminator that provides a balanced, non-distorting, optimized laminating force.

20. The assembly of claim 17, wherein the mask element and relief-forming precursor are held in complete optical contact using vacuum drawdown.

21. The method of claim 1, wherein the non-thermally ablatable particles are not thermally ablated by the imaging of step A).

22. The method of claim 1, wherein the non-thermally ablatable particles are not ablated by imaging with an infrared imaging wavelength and imaging intensity.

* * * * *